US012134125B2

(12) United States Patent
Plaisted et al.

(10) Patent No.: US 12,134,125 B2
(45) Date of Patent: Nov. 5, 2024

(54) SYSTEMS AND METHODS FOR CASTING SPUTTERING TARGETS

(71) Applicant: Junora LTD, Biddeford, ME (US)

(72) Inventors: Dean Plaisted, Kennebunk, ME (US); Nancy Norberg, South Portland, ME (US); Paul Carter, Waterboro, ME (US); Larry Ferrin, Lebanon, ME (US); Patrick Morse, Tucson, AZ (US)

(73) Assignee: Junora LTD, Biddeford, ME (US)

( * ) Notice: Subject to any disclaimer, the term of this patent is extended or adjusted under 35 U.S.C. 154(b) by 0 days.

(21) Appl. No.: 17/798,950

(22) PCT Filed: Feb. 12, 2021

(86) PCT No.: PCT/IB2021/051195
§ 371 (c)(1),
(2) Date: Aug. 11, 2022

(87) PCT Pub. No.: WO2021/161255
PCT Pub. Date: Aug. 19, 2021

(65) Prior Publication Data
US 2023/0075617 A1     Mar. 9, 2023

Related U.S. Application Data

(60) Provisional application No. 62/975,848, filed on Feb. 13, 2020.

(51) Int. Cl.
*B22D 23/00* (2006.01)
*B22D 23/06* (2006.01)
(Continued)

(52) U.S. Cl.
CPC .......... *B22D 23/006* (2013.01); *B22D 23/06* (2013.01); *B22D 25/00* (2013.01); *B22D 27/04* (2013.01);
(Continued)

(58) Field of Classification Search
CPC ...... B22D 23/00; B22D 23/006; B22D 23/06; B22D 25/00; B22D 27/04; B22D 27/08
(Continued)

(56) References Cited

U.S. PATENT DOCUMENTS

| 5,819,837 A | 10/1998 | Hugo et al. |
| 2011/0089030 A1 | 4/2011 | Juliano et al. |

(Continued)

FOREIGN PATENT DOCUMENTS

FR     2775918 A3     9/1999

OTHER PUBLICATIONS

May 26, 2021 PCT International Search Report re International Application No. PCT/IB21/51195.
(Continued)

*Primary Examiner* — Kevin P Kerns
(74) *Attorney, Agent, or Firm* — Law Offices of Damon L. Boyd, PLLC

(57) ABSTRACT

Methods for manufacturing rotary target materials that allow a material to be cast in a melting zone of a casting vessel while the vessel is rotated such that a melting zone is below a casting zone. The vessel is sealed and the pressure inside the vessel is reduced and the exterior of the vessel is heated. The melting zone of the vessel is heated to a temperature that melts the material and releases any trapped gasses which can be pumped out using the vacuum pump. Once the melting zone and molten material have reached a specified temperature, outgassed, and the casting zone has reached a temperature to maximize adhesion and reduce voids and defects, the vessel is rotated until the melting zone is directly above the casting zone to transfer the material from the melting zone to the casting zone.

6 Claims, 2 Drawing Sheets

(51) Int. Cl.
  *B22D 25/00*     (2006.01)
  *B22D 27/04*     (2006.01)
  *B22D 27/08*     (2006.01)
  *C23C 14/34*     (2006.01)

(52) U.S. Cl.
  CPC .......... *B22D 27/08* (2013.01); *C23C 14/3414* (2013.01)

(58) Field of Classification Search
  USPC ................ 164/122, 128, 133, 136, 335, 336
  See application file for complete search history.

(56)               References Cited

U.S. PATENT DOCUMENTS

| | | |
|---|---|---|
| 2014/0083646 A1* | 3/2014 | Waniuk et al. ........ B22D 17/14 164/113 |
| 2014/0110077 A1 | 4/2014 | White |
| 2014/0202852 A1 | 7/2014 | Plaisted et al. |
| 2016/0008880 A1 | 1/2016 | Sobczak et al. |

OTHER PUBLICATIONS

May 26, 2021 PCT Written Opinion of the International Searching Authority re International Application No. PCT/IB21/51195.

\* cited by examiner

SYSTEMS AND METHODS FOR CASTING SPUTTERING TARGETS

CROSS REFERENCE TO RELATED APPLICATIONS

This patent application is a national stage entry application claiming priority under 35 U.S.C. § 371(c) to PCT/162021/051195, entitled "SYSTEMS AND METHODS FOR CASTING SPUTTERING TARGETS," filed Feb. 12, 2021, which is related to and claims priority under 35 U.S.C. § 119(e) to U.S. Provisional Patent Application No. 62/975,848, entitled "SYSTEMS AND METHODS FOR CASTING SPUTTERING TARGETS," filed Feb. 13, 2020.

BACKGROUND

Field

The present disclosure relates generally to systems and methods for manufacturing cast cylindrical rotary sputtering targets. Existing designs typically utilize large melt pots that are poured into individual cast molds, which are either inside a sealed casting chamber either with a reduced pressure or inert atmosphere or processed in atmosphere. These systems can make many castings in a single run but require large amounts of energy to run for small or large casting campaigns.

Other casting systems for cast rotary targets are designed to cast single targets. These systems often use a casting vessel with a separate melting vessel. The material is melted and, optionally outgassed in the melting vessel, and then gravity or pressure fed into the casting vessel through a temperature controlled heated piping system, usually with a valve. The temperature of the casting vessel is controlled to a value that increases the adhesion between the casting material and the backing tube material. The temperature control also reduces casting issues such as voids. The separation of the casting vessel and the melting vessel allows for thermal separation of the vessels, allowing them to be maintained at different temperatures which allows the casting vessel to be actively cooled without actively cooling the melting vessel.

Background

The existing designs require either significant power to make one or many targets in very large and expensive vacuum melting and casting systems, or require complex heated material delivery systems to deliver molten casting material from the melting vessel. Systems in accordance with the present disclosure reduce the complexity of melt delivery while utilizing a small casting chamber that makes the processing system relatively inexpensive to build and to run. The melt zone and casting zone are combined into a single casting vessel that is rotated to deliver the melted material from the melting zone to the casting zone using gravity when the respective zones have reached their optimum temperatures. Utilizing a single vessel reduces the complexity of the heating system, reduces the surface area and mass that needs to be heated, and lastly reduces the complexity of the material transfer equipment and process.

SUMMARY

The present invention works by allowing a solid material to be cast to be inserted into the melting zone of the casting vessel while the casting vessel is rotated such that the melting zone is below the casting zone. Once the casting vessel is sealed and the pressure inside the casting vessel has been reduced, for example, with a vacuum pump, the entire vessel is heated from the exterior of the vessel. The melting zone of the casting vessel is heated to a temperature that allows the material to enter a liquid state and release any trapped gasses which in turn can be pumped out using the vacuum pump. Once the melting zone and molten material have reached a specified material based temperature, outgassed for an allotted time, and the casting zone has reached a temperature to maximize adhesion and reduce voids and defects, the casting vessel can be rotated along an axis located between the melting zone and casting zone and extends perpendicular to a line created between these two zones. Once the melting zone is rotated to a level that starts the flow of molten material from the melting zone to the casting zone, the casting vessel will continue to rotate until the melting zone is directly above the casting zone and all the material has transferred from the melting zone to the casting zone. The rate of material transfer can be controlled with a casting vessel rotation rate and/or flow restricting orifices between the melt zone and the casting zone.

Once the molten casting material is in the casting zone of the casting vessel, the external sources of heat can be removed from the entire casting vessel and the hollow backing tube can be actively cooled using an active cooling mechanism. The speed at which the hollow backing tube is actively cooled can control the rate of growth and size of the grains in the casting material as it cools, limit thermal stresses between the hollow backing tube and the casting material, and reduce casting defects. Once the casting material has cooled, the casting vessel can be opened and the external mold pipe on the outside of the cast material can be removed from the cast target.

BRIEF DESCRIPTION OF THE DRAWINGS

The accompanying drawings are included to provide a further understanding of the disclosure and are incorporated in and constitute a part of this specification, illustrate embodiments of the disclosure, and together with the description serve to explain the principles of the disclosure, wherein.

DETAILED DESCRIPTION OF THE ILLUSTRATED EMBODIMENTS

Figure 1:
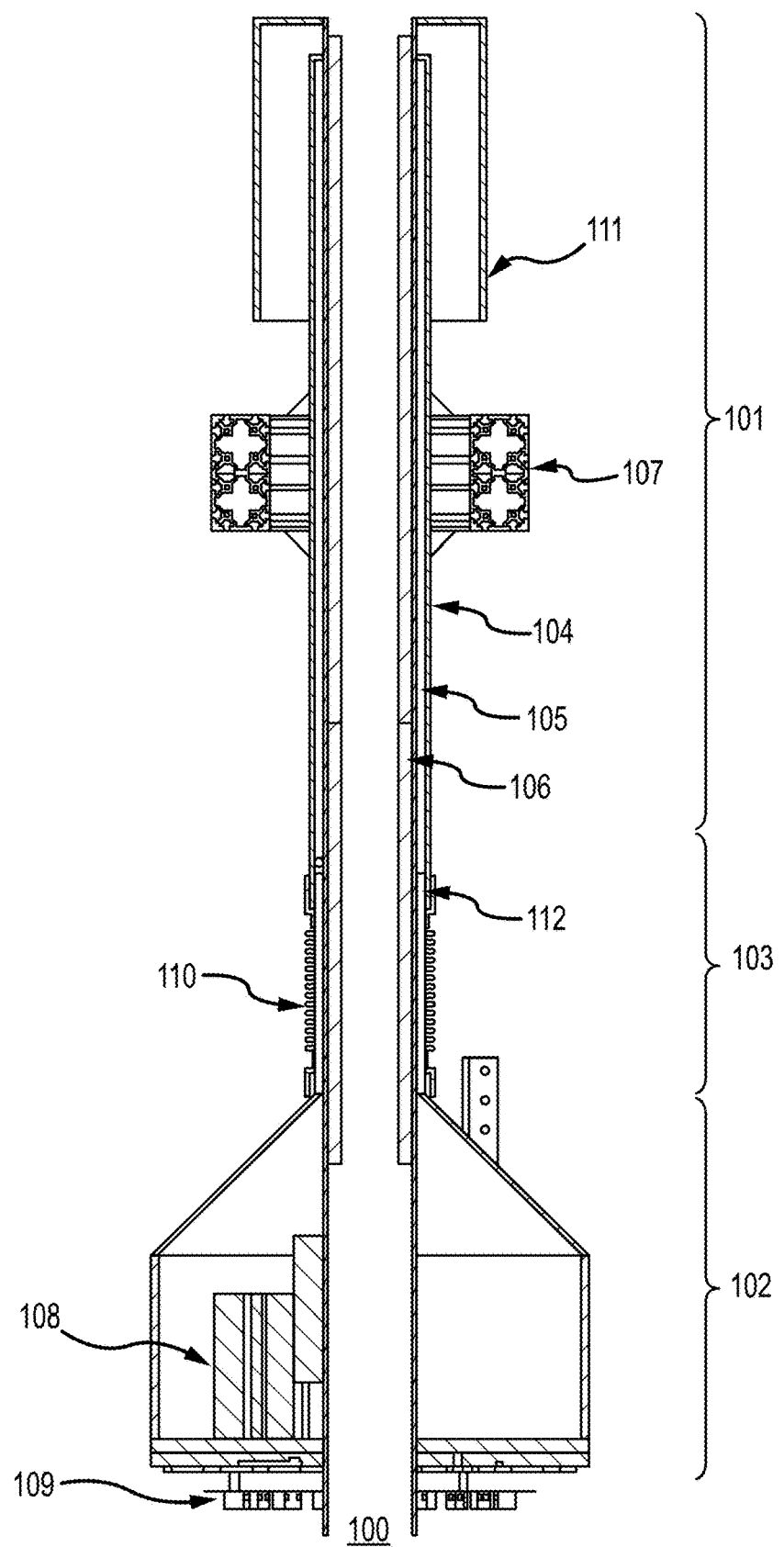
FIG. 1 shows a cross section of an entire pass through casting vessel with the casting zone located above the melting zone.

Persons skilled in the art will readily appreciate that various aspects of the present disclosure can be realized by any number of methods and systems configured to perform the intended functions. Stated differently, other methods and systems can be incorporated herein to perform the intended functions. It should also be noted that the accompanying drawing figures referred to herein are not all drawn to scale but may be exaggerated to illustrate various aspects of the present disclosure, and in that regard, the drawing figures should not be construed as limiting. Finally, although the present disclosure can be described in connection with various principles and beliefs, the present disclosure should not be bound by theory.

In general, the present disclosure provides systems and methods of rotary cathode target casting manufacturing that reduce or eliminate defects in the bulk cast material. In accordance with various aspects of the present disclosure, FIG. 1 is a cross-sectional view of an exemplary rotary cathode casting manufacturing device 100 showing the entire pass through casting vessel having a cavity with a casting zone 101 vertically above a melting zone 102 and having a thermal expansion compensation zone 103 between the casting zone 101 and melting zone 102. The melting zone 102 is initially filled (or "loaded") with a casting material 108 to be melted. Once the material 108 is sealed inside the melt zone 102, a vacuum pump is connected to the melt zone and the entire casting vessel is pumped down. Melt zone heaters 109 are used to bring the melt zone 102 up to a temperature that melts the casting material 108. Once the casting material 108 has melted and been outgassed, internal heaters 106 are used to heat the casting zone 101 to a temperature that will promote adhesion to a backing tube 105. The external heaters and insulation, not shown, are placed against the external mold pipe 104 and used to heat an external mold pipe 104. The external heater and external insulation guard 111 prevents active cooling liquids from contacting the external heater and insulation during the final cool down process.

The rotation bracket 107 allows the entire casting vessel to rotate to bring the melting zone 102 above the casting zone 101 causing molten casting material to flow through the thermal compensation zone 103 and past the bellows 110 via a pour collar 112 nested inside the bellows 110. When the casting vessel is completely inverted and the molten casting material 108 has flowed into the casting zone 101, the internal heater 106, external heaters, and melt zone heaters 109 are all turned off. Once the heaters have all been turned off, the internal heaters 106 can be removed and liquid cooling can be used to directly cool the target backing tube 105 internal surface. Directly cooling the internal target backing tube 105 surface will cause it to shrink along the length of the tube faster than the mold pipe tube 104 and the difference in thermal expansion is compensated for by the bellows 110.

Figure 2:
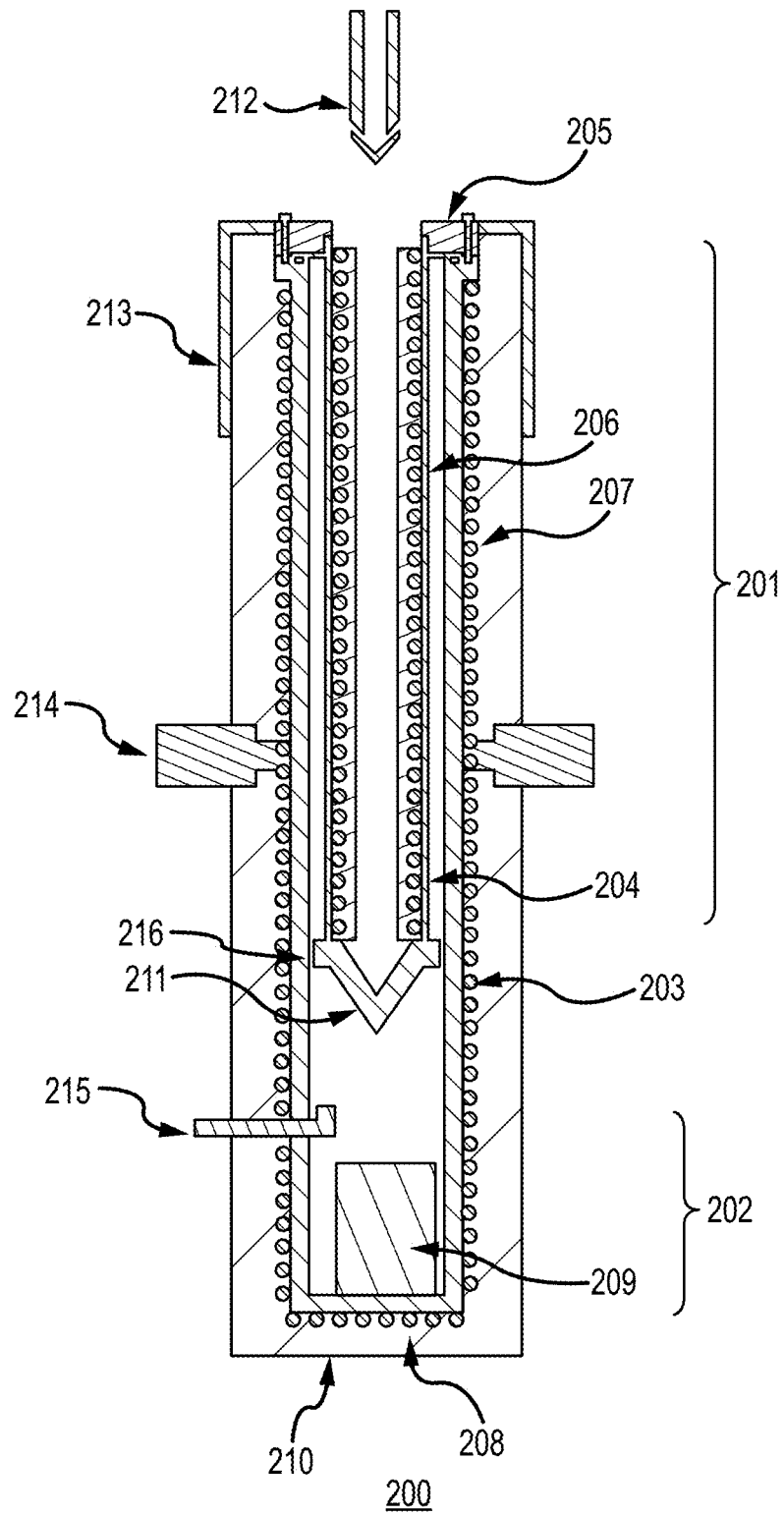
FIG. 2 shows a cross section of a single ended casting vessel with the casting zone located above the melting zone.

FIG. 2 shows an example cross section of a single ended casting vessel 200 in accordance with various aspects of the present disclosure. The single ended casting vessel comprises a casting zone 201 and a melt zone 202 that are initially configured with the casting zone 201 above the melt zone 202. The external wall of the casting vessel is the mold pipe 203 comprised of a continuous pipe from the end of the casting zone 201 to the end of the melting zone 202. The target backing tube 204 is directly connected to the top portion of the mold pipe 203 with a welded or bolted flange 205. In accordance with various aspects of the present disclosure, the casting material 209 to be melted is inserted into the end of the mold pipe 203 before the backing tube 204 is connected to the mold pipe 203. The backing tube 204 is sealed with a welded or bolted cone shaped flange 211 that has an external cone with a close tolerance concentricity feature 216 that can be in contact with the mold pipe 203 to maintain concentricity of the backing tube 204 to the mold pipe 203. The close tolerance concentricity block 216 can have holes or cuts in it to allow the molten casting material 209 to flow past it with little restriction.

When completely sealed, air in the casting vessel can be evacuated using a vacuum pump through the vacuum port and tube 215 located just above the melt zone 202. The vacuum port and tube 215 are pointed toward the casting zone 201 to prevent molten casting material 209 from entering the tube while the casting vessel is rotated about the rotation axis 214. The casting material 209 is primarily melted using the heat from the casting zone heaters 208 located at the end of the mold pipe 203.

Wrapped around the outside of the mold pipe 203 are the mold pipe heaters 207. The mold pipe heaters 207 can be split into multiple zones along the exterior of the mold pipe 203 to vary the temperature from the melting zone 202 to the casting zone 201. The mold pipe heaters 207 and melt zone heaters 208 are surrounded by external insulation 210 to prevent heat loss and reduce power consumption. The target backing tube heaters 206 are located inside the target backing tube 204 and may also be insulated. Once the casting material 209 has melted and the casting zone 201 has reached a temperature that enables the casting material 209 to wet the backing tube surface 204, the entire casting vessel is rotated about the rotation axis 214 causing the molten casting material 209 to flow into the casting zone 201. Once the molten casting material 209 is in the casting zone 201, the heaters 206, 207, 208 can be turned off. The backing tube heaters 206, 207, 208 and insulation 210 can then be removed and a liquid cooling nozzle 212 can be inserted into the backing tube 204 and moved upward until it reaches the welded or bolted cone shaped flange 211.

The heater and insulation coolant shield 213 prevent cooling liquids from wetting the insulation 210 and the mold pipe heaters 207. Once the casting material 209 has cooled, the mold pipe 203 can be machined off the re-solidified cast rotatable target material or, depending on the adhesion between the cast material and the mold pipe 203, the backing tube 204 with the attached cast material can be pressed out of the mold pipe 203. Utilizing liquid cooling on the inside surface of the backing tube and turning on the mold pipe heaters 207, it is possible to reduce the adhesion of the final cast material 209 and the mold pipe, allowing the cast target material with the backing tube to be separated from the mold pipe 203.

Finally, it will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

Likewise, numerous characteristics and advantages have been set forth in the preceding description, including various alternatives together with details of the structure and function of the devices and/or methods. The disclosure is intended as illustrative only and as such is not intended to be exhaustive. It will be evident to those skilled in the art that various modifications may be made, especially in matters of structure, deposition materials, elements, components, shape, size and arrangement of parts including combinations within the principles of the invention, to the full extent indicated by the broad, general meaning of the terms in which the appended claims are expressed. To the extent that these various modifications do not depart from the spirit and scope of the appended claims, they are intended to be encompassed therein.

We claim:

1. A rotatable sputtering target casting manufacturing process, comprising the steps of:
   loading a material to be melted into a melt zone within a casting vessel;
   sealing the casting vessel and reducing an internal pressure with a vacuum pump;

heating the material in the melt zone until it is a liquid metal;

creating a temperature gradient within a casting zone of the casting vessel that promotes wetting of the liquid metal onto a rotatable target backing tube and minimizes wetting onto an external mold pipe;

rotating the casting vessel to pour the liquid metal from the melt zone into the casting zone;

actively cooling the casting zone through the rotatable target backing tube to create a cast rotatable target material, wherein the cast rotatable target material is formed in the casting zone between an outside of a first hollow cylinder of a casting zone wall and an inside of a second hollow cylinder maintained concentric to each other; and removing the cast rotatable target material from the casting vessel by removing the external mold pipe and retaining an inner backing tube.

2. The rotatable sputtering target casting manufacturing process of claim 1, wherein the casting zone is cooled at a controlled rate to control grain size and to limit thermal stresses.

3. The rotatable sputtering target casting manufacturing process of claim 1, wherein a rate of material transfer is controlled with a casting vessel rotation rate.

4. The rotatable sputtering target casting manufacturing process of claim 1, wherein a rate of material transfer is controlled with at least one flow restricting orifice between the melt zone and the casting zone.

5. The rotatable sputtering target casting manufacturing process of claim 1, wherein the rotatable target backing tube extends completely through the casting vessel to allow a liquid cooling apparatus to be pulled through an interior of the rotatable target backing tube to cool the cast rotatable target material through the rotatable target backing tube.

6. The rotatable sputtering target casting manufacturing process of claim 1, wherein the rotatable target backing tube extends at least partially through the casting vessel and a liquid cooling apparatus is introduced from an open end of the rotatable target backing tube.

* * * * *